(12) United States Patent
Allanic

(10) Patent No.: US 9,632,420 B2
(45) Date of Patent: Apr. 25, 2017

(54) PRODUCTION OF A VOLUME OBJECT BY LITHOGRAPHY, HAVING IMPROVED SPATIAL RESOLUTION

(71) Applicant: PRODWAYS, Paris (FR)

(72) Inventor: André-Luc Allanic, Vierville sur Mer (FR)

(73) Assignee: PRODWAYS (FR)

( * ) Notice: Subject to any disclaimer, the term of this patent is extended or adjusted under 35 U.S.C. 154(b) by 0 days.

(21) Appl. No.: 14/759,796

(22) PCT Filed: Jan. 9, 2014

(86) PCT No.: PCT/EP2014/050326
§ 371 (c)(1),
(2) Date: Jul. 8, 2015

(87) PCT Pub. No.: WO2014/108473
PCT Pub. Date: Jul. 17, 2014

(65) Prior Publication Data
US 2015/0355553 A1    Dec. 10, 2015

(30) Foreign Application Priority Data

Jan. 9, 2013 (FR) .................................... 13 50177

(51) Int. Cl.
*G03F 7/22* (2006.01)
*G03F 7/207* (2006.01)
(Continued)

(52) U.S. Cl.
CPC ........ *G03F 7/70058* (2013.01); *B29C 67/007* (2013.01); *G03F 7/0035* (2013.01);
(Continued)

(58) Field of Classification Search
None
See application file for complete search history.

(56) References Cited

U.S. PATENT DOCUMENTS 4,627,010 A * 12/1986 Kosugi ............... G03F 7/70425
257/E21.211
5,133,987 A * 7/1992 Spence .................. B23K 26/04
118/620
(Continued)

FOREIGN PATENT DOCUMENTS

EP    1344633 A1    9/2003
JP    04-305438    * 10/1992
(Continued)

OTHER PUBLICATIONS

Machine translation of WO 1995/015841 (1995).*
(Continued)

*Primary Examiner* — Martin Angebranndt
(74) *Attorney, Agent, or Firm* — Lerner, David, Littenberg, Krumholz & Mentlik, LLP

(57) ABSTRACT

The present invention concerns a method for producing a volume object by lithography, comprising a projection of the projection image onto a plane to be illuminated of the layer of material, which involves:
- moving the mask in a movement having a component along an oblique axis forming an angle with the plane to be illuminated, and
- transforming a movement of the mask having a component along the oblique axis forming the angle with the plane to be illuminated into a displacement of the projection image on the plane to be illuminated along the first direction of the displacement contained in the plane to be illuminated by means of a mirror that reflects the projection image coming from the mask towards the plane to be illuminated.

14 Claims, 3 Drawing Sheets

Figure 1:
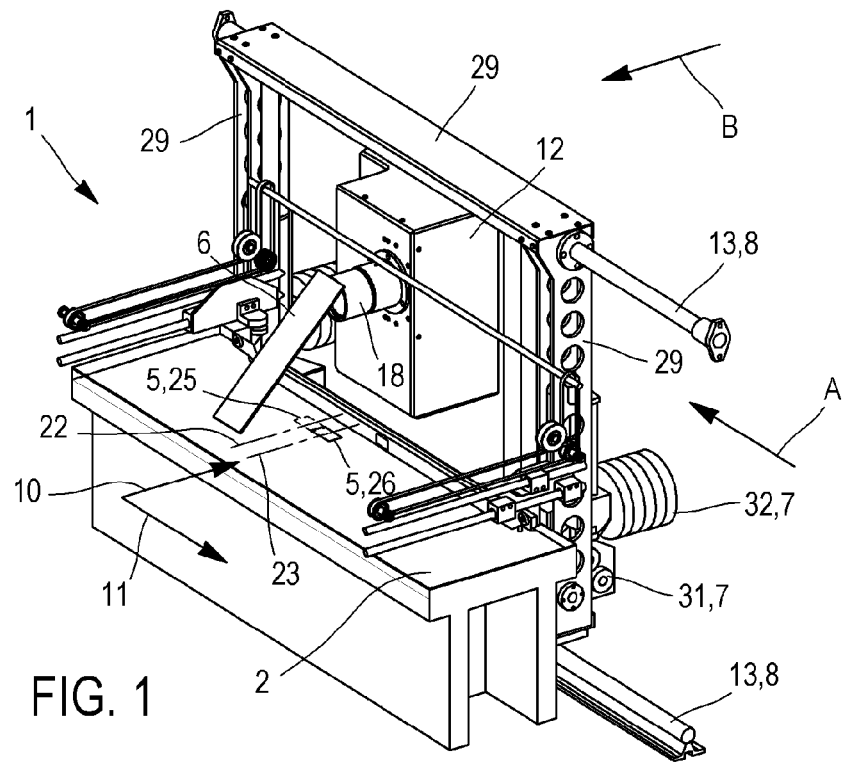

(51) Int. Cl.
 B29C 67/00 (2006.01)
 B29C 67/24 (2006.01)
 G03F 7/20 (2006.01)
 G03F 7/00 (2006.01)
(52) U.S. Cl.
 CPC .......... *G03F 7/0037* (2013.01); *G03F 7/2057* (2013.01); *G03F 7/22* (2013.01); *Y10T 428/24479* (2015.01)

(56) References Cited

U.S. PATENT DOCUMENTS

| | | | | |
|---|---|---|---|---|
| 5,247,180 A | * | 9/1993 | Mitcham | B29C 67/007 250/492.1 |
| 7,088,432 B2 | * | 8/2006 | Zhang | G03F 7/2057 264/401 |
| 7,670,541 B2 | * | 3/2010 | Kuzusako | B29C 67/0066 264/401 |
| 2006/0147845 A1 | * | 7/2006 | Flanigan | G02F 1/1313 430/322 |
| 2011/0001272 A1 | * | 1/2011 | Honda | B29C 67/0066 264/401 |

FOREIGN PATENT DOCUMENTS

| | | | |
|---|---|---|---|
| JP | 07-290578 | * | 11/1995 |
| JP | 08-281810 | * | 10/1996 |
| JP | 09-213623 | * | 8/1997 |
| JP | 2005-268439 | * | 9/2005 |
| JP | 2006-330386 | * | 12/2006 |
| WO | 9515841 A1 | | 6/1995 |

OTHER PUBLICATIONS

French Preliminary Search Report for Application No. FR1350177 dated Sep. 30, 2013.
International Search Report for Application No. PCT/EP2014/050326 dated Feb. 24, 2014.

* cited by examiner

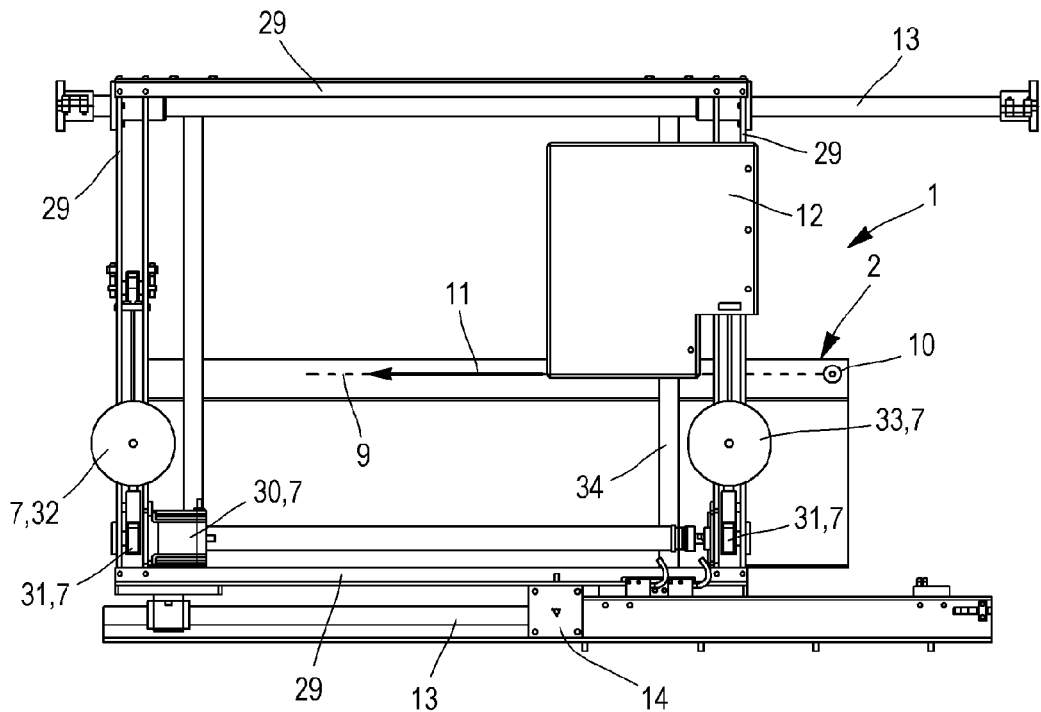
FIG. 5
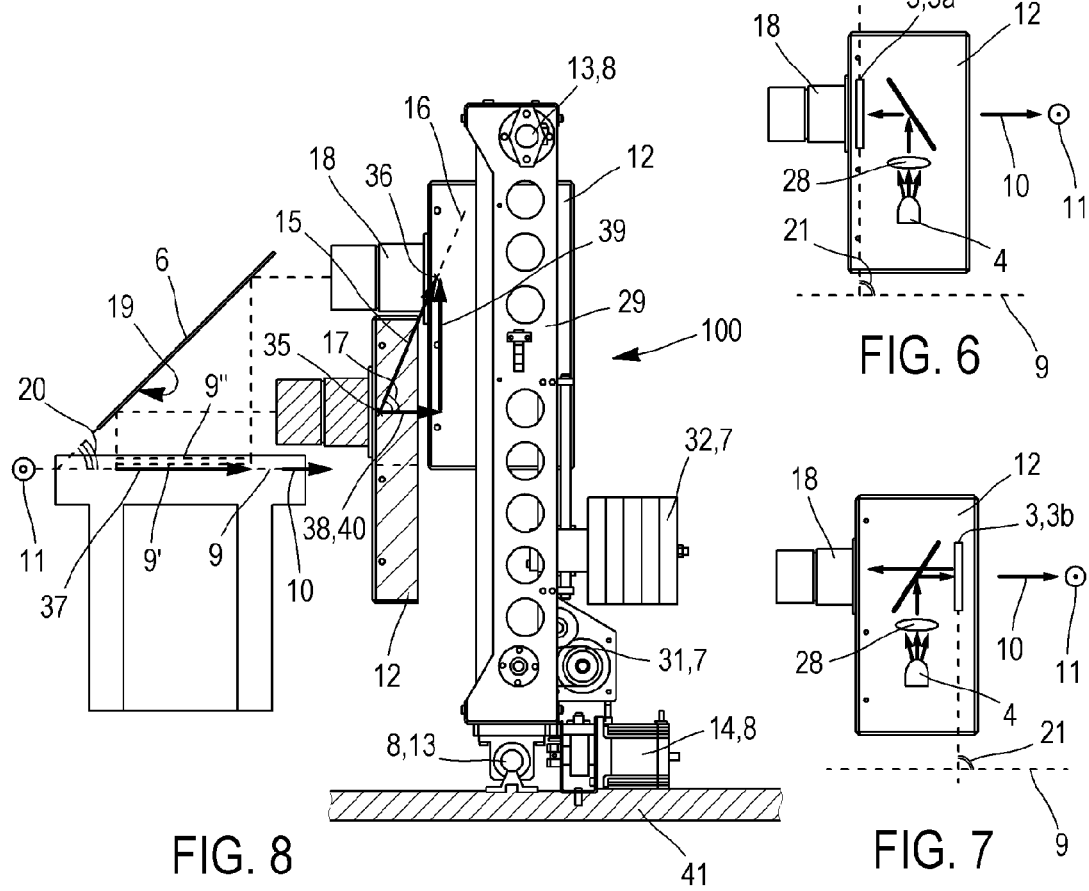
FIG. 8
FIG. 6
FIG. 7

PRODUCTION OF A VOLUME OBJECT BY LITHOGRAPHY, HAVING IMPROVED SPATIAL RESOLUTION

CROSS REFERENCE TO RELATED APPLICATIONS

This application is a national phase entry under 35 U.S.C. §371 of International Application No. PCT/EP2014/050326, filed Jan. 9, 2014, published in French, which claims the benefit of French Patent Application No. 1350177, filed Jan. 9, 2013, the disclosures of which are hereby incorporated herein by reference.

TECHNICAL FIELD

The present invention relates to a device for manufacturing a volumetric object by lithography. It also relates to a method implemented by such a device, and a product obtained by the device according to the invention.

The invention makes it possible in particular to accomplish several lithographic operations on superimposed layers in succession so as to manufacture a product in three dimensions. The field of the invention is therefore more particularly, but without limitation, that of rapid prototyping and of stereolithography.

STATE OF THE PRIOR ART

Product (typically prototype) manufacturing methods in three dimensions are known using stacking of layers, as for example by stereolithography or by depositing filaments (or FDM for "fused deposition modeling").

The principle of operation of stereolithography is the following:
1) at least one projection image is projected onto a photoreactive layer, said photoreactive layer solidifying in the portion illuminated by the projection image (the projection image generally forms a pattern, obtained by the interaction of a light source and a mask), then
2) the partially solidified layer is covered with a new photoreactive layer, then
3) at least one projection image is projected again on this new photoreactive layer,
steps 2) and 3) being repeated as many times as necessary to form a product in three dimensions. Generally, the projection image varies for each layer. For example, to create a ball, a disk is solidified, the diameter whereof increases from a first layer to a median layer, then decreases from the median layer to a last layer.

This technique makes it possible to make products in three dimensions directly in a photo-polymerizable resin without machining. The solidified image or image to be solidified of a layer is called the desired image. The projection image can be much smaller than the desired image: in that case, it is necessary to displace the projection image into different parts of a layer while modifying that projection image.

One challenge of stereolithography, as represented for example by a device according to document EP 1,344,633B1 or U.S. Pat. No. 5,247,180, is to improve its spatial resolution. This resolution is currently limited, particularly by the wavelength and the optical quality of the projection image generated by a mask and different lenses.

Moreover, it generally desirable to simplify the construction and the operation of the lithography devices.

Document WO 95/15841 has a lithography device, including in particular an "active" mask, said mask being able to take the form of a liquid crystal bar which illuminates the entire width of a trough of photosensitive material. The image formed over this entire width can be displaced in a single direction (direction F in FIG. 5).

This document also mentions the possibility of projecting the image of the mask onto a window submerged in a trough filled with liquid resin, the window rising gradually as the object is formed. According to this possibility, the masks and other optical elements of the device are joined to and accompany the vertical movement of the window.

The aim of the present invention is to propose a method or device for lithographing 3D objects at improved resolution.

DISCLOSURE OF THE INVENTION

This objective is attained with a manufacturing device for a volumetric object by lithography, including:
 a container arranged to accommodate, in a working volume, a layer of material,
 a mask and a radiation source arranged to create together a projection image leaving the mask,
 means for projecting the projection image onto a plane to be illuminated within the working volume, these projection means including means for displacing the projection image within the plane to be illuminated along a first displacement direction and means for displacing the projection image in the plane to be illuminated along a second displacement direction different from the first direction and not superimposed on the first direction,
wherein means for displacing the projection image along the first displacement direction include:
 means for displacing the mask in a forward movement having a component along an oblique axis forming an angle with the plane to be illuminated,
 and preferably the means (typically a mirror placed to reflect toward the plane to be illuminated the projection image produced by the mask) to transform the movement of the mask having the component along the oblique axis forming the angle with the plane to be illuminated into a displacement of the projection image on the plane to be illuminated along the first displacement direction contained in the plane to be illuminated.

The means for displacing the mask in a forward movement having the component along the oblique axis are preferably arranged to displace the mask along the oblique axis.

The oblique axis preferably forms a right angle with the plane to be illuminated.

The device according to the invention can also include means for modifying dynamically the projection image in a manner synchronized with the displacement of the projection image in the first direction, including means for dynamically modifying the mask in a manner synchronized with the movement of the mask having the component along the oblique axis.

The mirror can have a reflective surface arranged to reflect the projection image and inclined 45°, plus or minus 10°, with respect to the plane to be illuminated.

The means for projecting the image are preferably arranged to project this image so that, between the mask and the mirror, the projection image propagates parallel to the plane to be illuminated.

The mask can be not parallel, and is rather preferably perpendicular, to the plane to be illuminated.

The means for displacing the image along the first displacement direction can be arranged to displace the projection image in the plane to be illuminated in succession along several parallel lines, the means for displacing the projection image along the second displacement direction can be arranged to offset the projection image at the end of each finished line toward a following line parallel to the finished line, so that a position of the projection image on the plane to be illuminated along the finished line is bordered or partially superimposed with a position of the projection image on the plane to be illuminated along the following line.

The means for projecting the projection image on the plane to be illuminated are preferably arranged to be able to project the projection image on different possible planes to be illuminated, parallel and contained in the working volume.

According to yet another aspect of the invention, a method is proposed for manufacturing a volumetric object by lithography, including:
- supply within the working volume a layer of photosensitive material arranged to harden under the influence of radiation,
- creating, by a mask and a radiation source, a projection image produced by the masque,
- projection of the projection image on a plane to be illuminated of the material layer,
- displacement of the projection image in the plane to be illuminated along a first displacement direction and a displacement of the projection image in the plane to be illuminated along a second displacement direction different from the first direction and not superimposed on the first direction, these two displacement directions being contained within the plane to be illuminated, wherein, to displace the projection image along the first displacement direction:
- the mask is displaced in a movement having a component along an oblique axis forming an angle with the plane to be illuminated, and
- and preferably this movement of the mask having the component along the oblique axis forming an angle with the plane to be illuminated is transformed by displacing the projection image on the plane to be illuminated along the first displacement direction contained in the plane to be illuminated, typically by means of a mirror which reflects toward the plane to be illuminated the projection image produced by the mask.

To displace the mask with the movement having the component along the oblique axis, the mask is preferably displaced along the oblique axis.

The oblique axis preferably forms a right angle with the plane to be illuminated.

The method according to the invention can include, in the process of displacing in the first direction, a dynamic modification of the projection image synchronized with the displacement of the projection image in the first direction, this modification of the image being obtained by a dynamic modification of the mask synchronized with its movement having the component along the oblique axis.

The mirror can have a reflecting surface arranged to reflect the projection image and inclined at 45°, plus or minus 10° with respect to the plane to be illuminated.

Between the mask and the mirror, the projection image preferably propagates parallel to the plane to be illuminated.

The mask is preferably not parallel, and is preferably perpendicular, to the plane to be illuminated.

It is possible to displace the projection image in the plane to be illuminated, along the first displacement direction, successively along several parallel lines, and it is possible to displace the projection image along the second displacement direction to offset the projection image at the end of each finished line toward a following line parallel to the finished line, so that a position of the projection image on the plane to be illuminated on the finished line is bordered or partially superimposed with a position of the projection image on the plane to be illuminated on the following line.

The steps of the process are preferably repeated on several layers of superimposed photosensitive material.

Following another aspect of the invention, a volumetric product or object obtained by (stereo)lithography using a method or a device according to the invention is proposed.

DESCRIPTION OF THE FIGURES AND EMBODIMENTS

Figure 2:
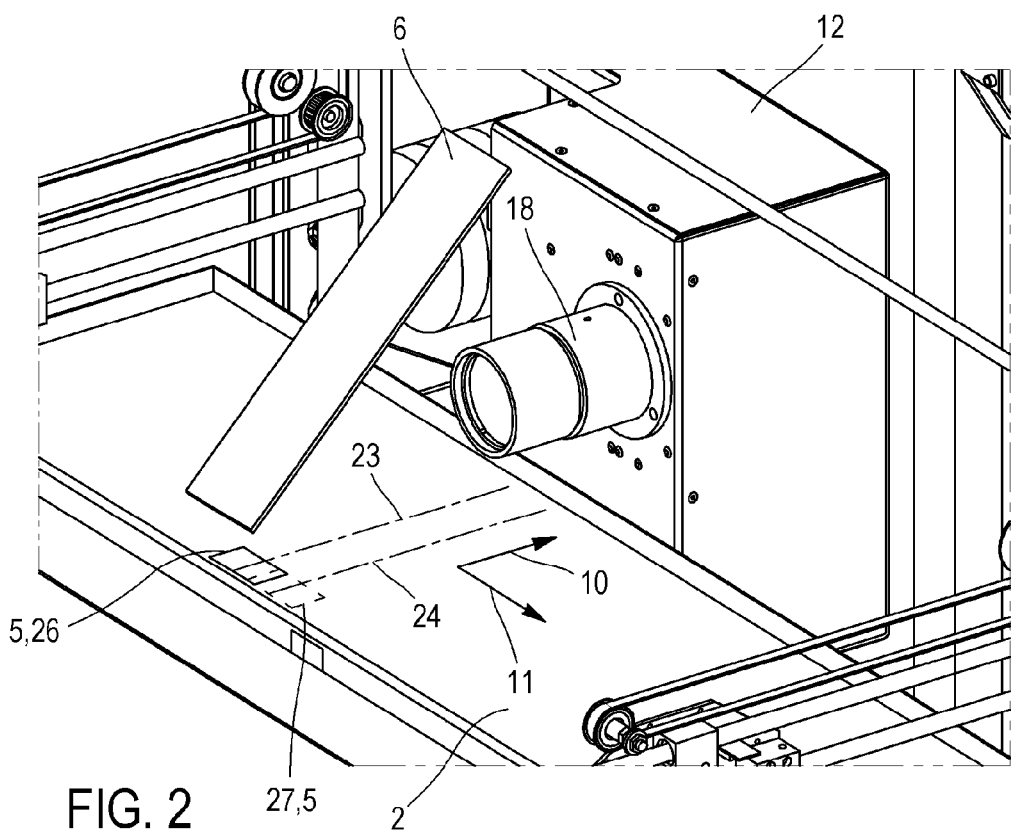
Figure 3:
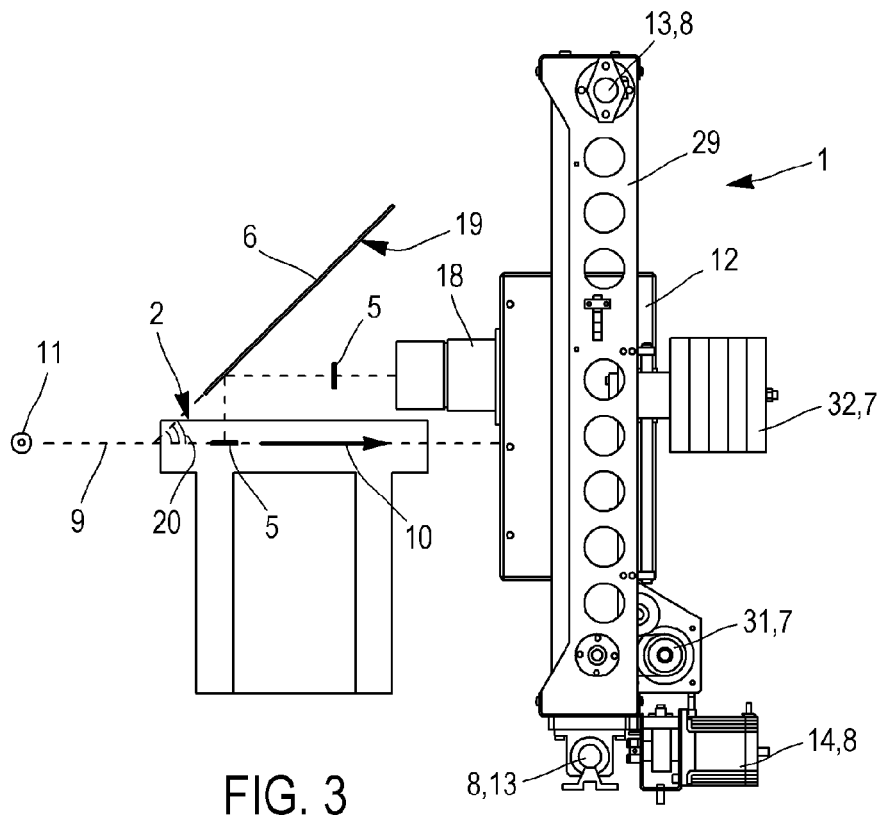
Figure 4:
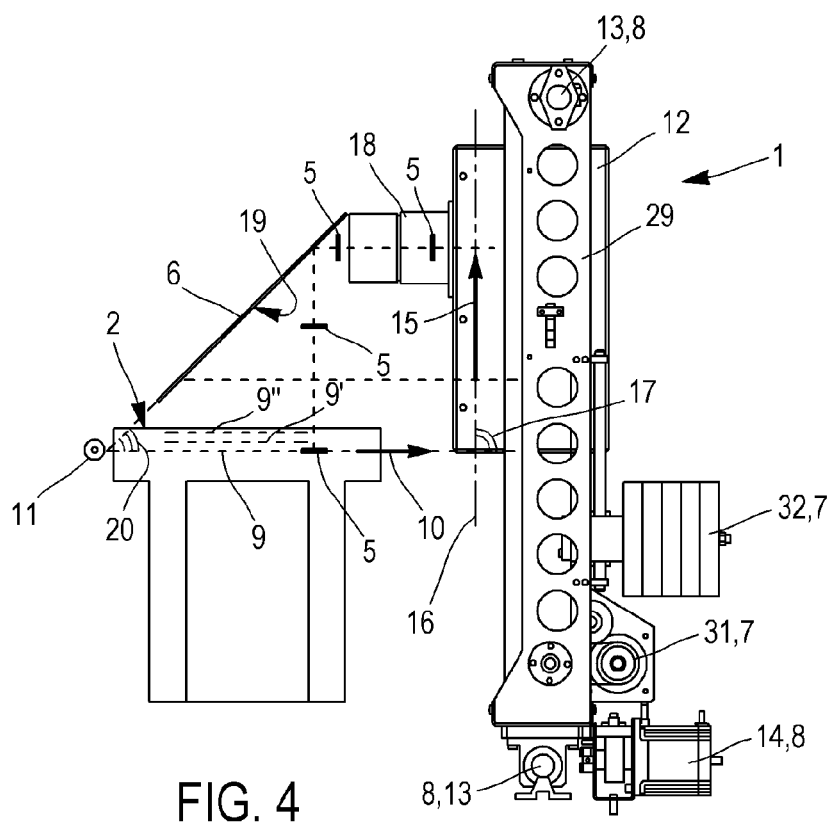

Other advantages and special features will be revealed upon reading the detailed description of implementations and embodiments which are in no way limiting, and the following appended drawings:

FIG. 1 is a perspective view of a first embodiment of a device according to the invention, with its head in the "high" position, FIG. 2 is a perspective view of a portion of the device according to the invention of FIG. 1, with its head in the "low" position, FIG. 3 is a profile view of the device according to the invention of FIG. 1 using the viewing axis A of FIG. 1, with its head in the "low" position, FIG. 4 is a profile view of the device according to the invention of FIG. 1 using the viewing axis A of FIG. 1, with its head in the "high" position, FIG. 5 is a rear view of the device according to the invention of FIG. 1 using the viewing axis B of FIG. 1, FIG. 6 is a schematic profile view of the interior of a first variant of the head 12 of the device according to FIG. 1, FIG. 7 is a schematic profile view of the interior of a second variant of the head 12 of the device according to the invention of FIG. 1, and FIG. 8 is a profile view of a second embodiment of the device according to the invention, with its head 12 in the "low" position and in the "high" position at two different instants to illustrate a movement of this head.

These embodiments being in no way limiting, it is possible in particular to consider variants of the invention including only one selection of features described hereafter, isolated from other described features (even if this selection is isolated within a sentence including these other features), if this selection of features is sufficient to confer a technical advantage or to differentiate the invention with respect to the prior art. This selection includes at least one functional feature preference without structural details, or with only a portion of the structural details if this portion alone is sufficient to confer a technical advantage or to differentiate the invention with respect to the state of the prior art.

We will first describe, with reference to FIGS. 1 to 7, a first embodiment of the device 1 according to the invention.

The device 1 is a stereolithography device.

The device 1 is designed to manufacture a volumetric object (such as a prototype) by lithography of several superimposed layers.

The device 1 includes a receptacle 2 arranged to accommodate, in a working volume, a layer of photosensitive or photoreactive material arranged to harden under the influence of a hardening radiation.

The hardening radiation is an electromagnetic radiation, typically of visible light (wavelength between 380 and 780 nanometers), or rather preferentially of ultraviolet light (wavelength typically comprised between 355 and 385 nanometers).

The photosensitive material is not necessarily a liquid. The photosensitive material is a liquid, a paste, a gel or any other soft material arranged to harden under the influence of the hardening radiation. For example, resins with the commercial reference Innovation Meditech FotoMed.LED A/Pattern/Flex 70 can be used as the photosensitive material. Pastes with metal or ceramic fillers can also be considered, based on for example materials developed in the year 2000 for the OptoForm process.

The receptacle 2 can be a reservoir (for example if the photosensitive material is a liquid) or a tray or a plate (for example if the photosensitive material is a gel or a paste) or even a grill (for example if the photosensitive material is a paste with essentially no flow).

The device 1 also includes a mask 3 and a source 4 arranged to emit the hardening radiation.

The source 4 is generally coupled to a lens 28 or to a set of lenses 28.

The source 4 consists typically of a power electroluminescent diode (ELD) of commercial reference Nichia NLBU21P02.

The mask 3 can for example be:
either (FIG. 6) a liquid crystal screen 3a consisting of liquid crystal pixels, each pixel being illuminated (transparent to the hardening radiation) depending on the state of the liquid crystal of that pixel,
or (FIG. 7) a chip (DLP for "Digital Light Processor," for example of the XGA or 1080p type) 3b consisting of a grid of movable mirrors, each movable mirror corresponding to a pixel of the mask 3 which is illuminated or turned off depending on the position of this movable mirror.

The mask 3 therefore includes pixels. The mask 3 and the source 4 are arranged to create together a projection image 5 produced by the mask 3:
Either by reflection, by the mask 3 (example of the DLP chip), of the hardening radiation coming from the source 4,
Or by transmission, through the mask 3 (example of the liquid crystal screen), of the hardening radiation coming from the source 4,
the illuminated or turned off state of each of the pixels of the mask 3 corresponds to a pixel of the projection image 5 respectively illuminated or not by the hardening radiation.

The mask 3 and the source 4 are grouped within the interior of a head 12.

The head 12 is mounted within a (metal) frame 29, typically of rectangular shape.

The device 1 also includes means 6, 7, 8 to project the projection image 5 in a focused manner onto a plane to be illuminated 9 in the working volume.

These means of projection 6, 7, 8 include means 6, 7 to displace the projection image 5 in the plane to be illuminated 9 along a first displacement direction 10. These means of projection 6, 7, 8 include means 8 for displacing the projection image in the plane to be illuminated 9 along a second displacement direction 11.

The second displacement direction 11 is different from the first direction 10 and is not superimposed (i.e. not parallel) to the first direction 10. Preferably, the second displacement direction 11 is perpendicular to the first direction 10. These two displacement directions 10, 11 are contained in the plane 9 to be illuminated.

The projection image 5, produced by the head 12, can thus be displaced in two different directions of the plane to be illuminated 9. In this manner, by displacing this image 5 in the two directions, it is possible to cover a desired region of the plane 9.

The means 8 for displacing the projection image along the second displacement direction 11 typically include one or several (metal) bar(s) 13 extending along this second direction 11, and a motor 14 arranged to displace the mask 3 and the source 4 (more exactly the head 12, more exactly the frame 29) along the bar(s) 13 and therefore in this second direction 11. The motor 14 causes the frame 29 to slide along the at least one bar 13.

The means 6, 7 for displacing the projection image 5 along the first displacement direction 10 include:
means 7 for displacing the mask 3 in a movement having a component 15 along an oblique axis 16 forming a (nonzero) angle 17 with the plane to be illuminated 9.
a mirror 6 arranged to:
reflect toward the plane to be illuminated 9 the projection image 5 produced by the mask 3
and thus transform "the movement of the mask 3 having a component 15 along the oblique axis 16 forming the angle 17 with the plane to be illuminated 9" into "a displacement of the projection image 5 on the plane to be illuminated 9 along the first displacement direction 10 contained in the plane to be illuminated 9."

In other words, the combination:
of the fact that the image 5 produced by the mask 3 has an oblique movement with respect to the plane to be illuminated 9, with a component 15,
and the fact that this image 5 resulting from the mask 3 is projected toward the mirror so as to be reflected into a projection image 5 toward the plane to be illuminated 9,
results in a displacement of this projected image 5 onto the plane to be illuminated 9.

And this displacement is obtained in a first direction 10.

This first direction 10, contained in the plane to be illuminated 9, is typically the light emission direction by the head 12. As a variant, the direction 10 can be a direction of the plane 9 which includes a component in the light emission direction by the head 12.

Preferably, the displacement of the mask 3 includes a displacement of the mask 3 with respect to the mirror 6, and means 7 for displacing the mask 3 are arranged to displace said mask 3 with respect to the mirror 6.

It is specified that in this text the displacement of the mask 3 is equated to the displacement of the head 12, of which the mask is an integral part.

After leaving the mask 3 and before attaining the plane to be illuminated 9, the projection image 5 is formed (dimensioning, focus, etc.). In particular, leaving the mask 3 and before the mirror 6, the projection image 5 passes through several lenses within an objective lens 18 (an integral part of head 12) which forms (dimensioning, focus, etc.) the projection image 5.

The means 7 for displacing the mask 3 according to the movement having the component 15 along the oblique axis 16 are arranged to displace the mask 3 along the oblique axis 16, i.e. with no other component of movement than the component 15.

The means 7 for displacing the mask 3 in the movement having the component 15 along the oblique axis 16 include for example a motor 30, a transmission system 31 (typically including belts), at least one (preferably two) counterweights 32, 33, and a bar 34 (typically metal). The bar 34 is an integral part of the frame 29. The bar 34 extends longitudinally parallel to the oblique axis 16 or preferably perpendicularly to the plane to be illuminated. The head 12 is mounted on the bar 34 and can be displaced along this bar 34. The motor 30 is arranged to move the head 12 along this bar 34. The transmission system 31 is arranged, during movement of the mask 3 or of the head 12 in the direction along the axis 16 (upward or downward), [to] displace each counterweight 32, 33 in an opposite direction (respectively downward or upward).

As illustrated in FIG. 4, the oblique axis 16 forms a right angle 17 with the plane 9 to be illuminated, that is it is perpendicular to the plane to be illuminated 9.

Thus, according to the invention, to displace the projection image 5 in the plane to be illuminated 9 which is horizontal, the mask 3 is displaced vertically, and therefore the head 12 which is relatively heavy, that is to say that the mask 3, and therefore the head 12 is displaced in the direction of their own weight. This solution is much more stable mechanically and allows much better spatial lithography resolution. Indeed, according to the prior art, when a head and its mask are displaced horizontally along a horizontal bar, this bar can bend under the weight of the head, and can cause problems in pointing the head and hence in the projection image, problems of repeatability in orientation of the head and hence of the projection image, and hence problems of spatial resolution of the lithography of each layer.

The device 1 also includes means for modifying the projection image 5 in the plane 9 synchronously with the displacement of the projection image 5 in the first direction 10 (based on the principle of operation of document EP 1,344,633) including however, in the specific case of the invention, means for modifying the mask 3 synchronously with the movement of the mask 3 having the component 15 along the oblique axis 16. These means of communication typically include means for calculating or controlling (including a processor, and/or an analogue and/or digital circuit, and or a central processing unit, and/or software means) arranged to calculate the projection image 5 (i.e. which are the pixels of the projection image 5 illuminated by the hardening radiation and at what intensity, which can vary from one pixel to another) depending on a desired image and the current position of the projection image 5 in the plane to be illuminated 9 (i.e. the position of the head 12 or of the mask 3 along the axis 16).

Means of calculation and of control are further arranged to control all the motors of the device 1.

The mirror 6 has a reflecting surface 19 arranged to reflect the projection image 5 and inclined at an angle 20 of 45°, plus or minus 10° (preferably plus or minus 1°) with respect to the plane to be illuminated 9.

Preferably, the mirror 6 is fixed in the first direction with respect to the plane to be illuminated.

The means 6, 7, 8 for projecting the projection image 5 are arranged to project that image so that, between the mask 3 and the mirror 6 the projection image 5 is propagated parallel to the plane 9 to be illuminated.

Means 6, 7, 8 to project the projection image 5 are arranged to project that image so that, between the mirror 6 and the plane to be illuminated 9, the projection image is propagated perpendicularly to the plane 9 to be illuminated.

The mask 3 is planar. The plane of the mask 3 (plan of the DLP chip or the liquid crystal screen) is not parallel to the plane 9 to be illuminated, and forms an angle 21, preferably perpendicular, to the plane 9 to be illuminated.

The means 6, 7 for displacing the projection image 5 along the first displacement direction 10 are arranged to displace in the plane 9 the image of the projection image 5 in succession along several parallel lines 22 to 24 (only three lines are shown in the figures so as not to overload them).

Means 8 for displacing the projection image 5 along the second displacement direction 11 are arranged to offset, in the plane 9 the projection image at the end of each finished line 22 or 23, toward a following line respectively 23 or 24 parallel to the finished line, so that:

a position 25 of the projection image 5 on the plane to be illuminated 9 along the finished line 22 is bordered with a position 26 of the projection image 5 on the plane to be illuminated 9 along the following line 23 (meaning that an edge of the projection image 5 in its position 25 along the finished line 22 touches an edge of the projection image 5 in its position 26 along the following line 23, but the position 25 of the projection image 5 on the plane to be illuminated 9 along the finished line 22 is not superimposed with the position 26 of the projection image 5 on the plane to be illuminated 9 along the following line 23) or a position 26 of the projection image 5 on the plane 9 to be illuminated along a finished line 23 is partially superimposed with a position 27 of the projection image 5 on the plane 9 to be illuminated along the following line 24.

To manufacture objects in three dimensions by superposition of several layers, means 6, 7, 8 for projecting the projection image 5 in focus on a plane to be illuminated 9 are arranged to be able to project the projection image 5 in focus on different possible planes 9, 9', 9" to be illuminated, parallel and contained in the working volume, typically by adjustment of the objective lens 18.

A fabrication method according to the invention for a volumetric object or product by stereolithography, implemented in the device 1, then includes the following steps:

a) supplying, in the working volume, the layer of photosensitive material arranged to harden under the influence of the hardening radiation, b) creation, by the radiation source 4 emitting the hardening radiation and the mask 3 reflecting or transmitting the hardening radiation emitted by the source 4, of the projection image 5 leaving the mask 3, c) a projection of the projection image 5, in focus, on the plane to be illuminated 9 of the material layer, d) displacement of the projection image 5 in the plane 9 along the first displacement direction 10 by the means 6, 7 then, preferably not simultaneously, displacement of the projection image 5 in plane 9 along the second displacement direction 11 by the means 8.

To displace the projection image 5 along the first displacement direction 10:

the mask 3 is displaced in the movement having the component 15 along the oblique axis 16 forming an angle 17 with the plane to be illuminated; between the mask 3 and the mirror 6, the projection image 5 propagates parallel to the plane to be illuminated 9, and this "movement of the mask 3 having the component 15 along the oblique axis 16" is transformed into "displacement of the projection image 5 in the plane to be illuminated 9 along the first displacement direction 10" by means of the mirror 6 which reflects toward the plane to be illuminated 9 the projection image 5 produced by the mask 3. Between the mirror 6 and the plane to be illuminated 9, the projection image 5 propagates perpendicularly to the plane to be illuminated 9.

During displacement along the first direction 10, the projection image 5 is modified (by calculation and control means) synchronously with the displacement of the projection image 5 in the plane 9 in the first direction 10, this modification of the image 5 being obtained by a modification of the mask 3 synchronized with the displacement of the mask 3 in its movement having the component 15 along the oblique axis 16.

Thus the projection image 5 is displaced in the plane 9 along the first displacement direction 10 in succession along different parallel lines 22, 23, 24, and the projection image 5 is displaced in the plane 9 along the second displacement direction 11 to offset the projection image 5 at the end of each finished line 22, 23 toward a following line, respectively 23, 24 parallel to the finished line.

Steps a) to d) are repeated for several superimposed layers of photosensitive materials to manufacture an object in three dimensions.

A second embodiment of the device 100 according to the invention will now be described with reference to FIG. 8, but only with respect to its differences with respect to the first embodiment of the device 1. In particular the features, common numerical labels and the method implemented will not be fully described again.

In the device 100, the bar 34 does not extend longitudinally, parallel to the oblique axis 16, but does however still extend perpendicular to the plane to be illuminated 9.

In the device 100, the axis 16 is oblique as before with respect to the plane to be illuminated 9, that is it is not contained in or parallel to the plane to be illuminated 9. On the other hand, the axis 16 is not perpendicular to the plane to be illuminated 9.

FIG. 8 illustrates two positions of the mask 3 or of the head 12:
- a first position 35 of the mask 3 or of the head 12 (hatched drawing of the head 12) at the beginning of the movement of the mask 3 having the component 15 along the oblique axis 16 forming the angle 17 with the plane to be illuminated 9 for a displacement of the image 5 in the plane 9 along line 23, and
- a second position 36 of the mask 3 or of the head 12 (un-hatched drawing of the head 12) at the end of the movement of the mask 3 having the component 15 along the oblique axis 16 forming the angle 17 with the plane to be illuminated 9 for a displacement of the image 5 in the plane 9 along this same line 23.

It is noted that the means 6, 7 for displacing the projection image 5 in the plane to be illuminated 9 along the first displacement direction 10 are designed so that, in the same time interval, the distance 37 traveled by the projection image 5 in the plane to be illuminated 9 along the first displacement direction 10 is greater than the distance 38 traveled by the mask 3 (or the head 12) along the first displacement direction 10.

It is noted that the means 7 for displacing the mask 3 in the movement having the component 15 along the oblique axis 16 are designed so that the movement breaks down into two perpendicular components:

- a first component 39 perpendicular to the plane to be illuminated 9, and
- a second component 40 parallel to the plane to be illuminated, preferably more precisely parallel to the first displacement direction 10.

For that purpose, in this example of the second embodiment, the frame 29 is also arranged to displace, thanks to a motor, along at least one bar 41 extending longitudinally along the first displacement direction 10.

In addition, the advantage of improving stability, of vibration reduction, of improvement in the repeatability of positioning and improvement of the resolution of lithography is always present (albeit with less performance) as for the first embodiment, because the mask 3 (or the head 12) is always displace at least in part (component 39) along the vertical axis of its own weight to horizontally displace the image 5 in the plane 9.

Of course, the invention is not limited to the examples which have just been described, and numerous modifications can be applied to these examples without departing from the scope of the invention.

Of course, the different features, forms, variants and embodiments of the invention can be associated with one another according to various combinations to the extent that they are not incompatible or exclusive of one another. In particular, all the variants and embodiments describe previously are combinable with one another.

The invention claimed is:

1. A method for manufacturing a volumetric object by lithography, including:
   a) supplying in a working volume a layer of photosensitive material arranged to harden under the influence of a radiation,
   b) creating, through a mask and a radiation source, a projection image leaving the mask,
   c) projecting the projection image onto a plane to be illuminated of the material layer,
   d) displacing the projection image in the plane to be illuminated along a first displacement direction and displacing the projection image in the plane to be illuminated along a second displacement direction different from the first direction and not superimposed on the first direction, these two displacement directions being contained within the plane to be illuminated,
   wherein to displace the projection image along the first displacement direction:
      the mask is displaced with respect to the plane to be illuminated in a movement along an oblique axis forming an angle with the plane to be illuminated, said oblique axis not being perpendicular or parallel to the plane to be illuminated,
      this movement of the mask having the component along the oblique axis forming the angle with the plane to be illuminated is transformed by displacing the projection image on the plane to be illuminated along the first displacement direction contained in the plane to be illuminated by means of a mirror which reflects toward the plane to be illuminated the projection image produced by the mask.

2. The method according to claim 1, wherein said method includes, during displacement along the first direction, a dynamic modification of the projection image synchronized with displacement of the projection image in the first direction, this modification of the image being obtained by a dynamic modification of the mask synchronized with the displacement of the mask in its movement having the component along the oblique axis.

3. The method according to claim 1, wherein the mirror has a reflecting surface arranged to reflect the projection image and inclined at 45° plus or minus 10° with respect to the plane to be illuminated.

4. The method according to claim 1, wherein, between the mask and the mirror, the projection image propagates parallel to the plane to be illuminated.

5. The method according to claim 1, wherein the mask is not parallel, and is preferably perpendicular, to the plane to be illuminated.

6. The method according to claim 1, wherein the projection image is displaced in the plane to be illuminated along the first displacement direction in succession along several parallel lines, and the projection image is displaced along the second displacement direction to offset the projection image at the end of each finished line toward a following line parallel to the finished line, so that a position of the projection image on the plane to be illuminated along the finished line is bordered or partially superimposed on a position of the projection image on the plane to be illuminated along the following line.

7. The method according to claim 1, wherein these steps are repeated over several superimposed layers of photosensitive material.

8. A device for manufacturing a volumetric object by lithography, including:
a container arranged to accommodate, in a working volume, a layer of material,
a mask and a radiation source arranged to create together a projection image leaving the mask,
means to project the projection image on a plane to be illuminated into the working volume, these means of projection including means to displace the projection image in the plane to be illuminated along a first displacement direction and means for displacing the projection image in the plane to be illuminated along a second displacement direction different from the first direction and not superimposed on the first direction, wherein the means for displacing the projection image along the first displacement direction include:
means for displacing the mask with respect to the plane to be illuminated according to a movement along an oblique axis forming an angle with the plane to be illuminated, said oblique axis not being perpendicular or parallel to the plane to be illuminated,
a mirror arranged to reflect toward the plane to be illuminated the projection image produced by the mask and to transform the movement of the mask having the component along the oblique axis forming the angle with the plane to be illuminated into a displacement of the projection image on the plane to be illuminated along the first displacement direction contained in the plane to be illuminated.

9. The device according to claim 8, wherein said device further includes means for dynamically modifying the projection image synchronously with the displacement of the projection image in the first direction, including means for dynamically modifying the mask synchronously with the movement of the mask having the component along the oblique axis.

10. The device according to claim 8, wherein the mirror has a reflecting surface arranged to reflect the projection image and inclined at 45° plus or minus 10° with respect to the plane to be illuminated.

11. The device according to claim 8, wherein the means for projecting the projection image are arranged to project that image so that, between the mask and the mirror, the projection image is propagated parallel to the plane to be illuminated.

12. The device according to claim 8, wherein the mask is not parallel, and is preferably perpendicular, to the plane to be illuminated.

13. The device according to claim 8, wherein the means for displacing the projection image along the first displacement direction are arranged to displace the projection image in the plane to be illuminated in succession along several parallel lines, the means for displacing the projection image along the second displacement direction being arranged to offset the projection image at the end of each finished line toward a following line parallel to the finished line, so that a position of the projection image on the plane to be illuminated along the finished line is bordered or partially superimposed with a position of the projection image on the plane to be illuminated along the following line.

14. The device according to claim 8, wherein the means for projecting the projection image in the plane to be illuminated are arranged to be able to project the projection image on different possible planes to be illuminated, parallel and contained in the working volume.

* * * * *